US006661664B2

United States Patent
Sarno et al.

(10) Patent No.: US 6,661,664 B2
(45) Date of Patent: Dec. 9, 2003

(54) ELECTRONIC MODULE WITH HIGH COOLING POWER

(75) Inventors: Claude Sarno, Etoile S/Rhone (FR); Georges Moulin, Valence (FR)

(73) Assignee: Thales Avionics S.A., Velizy Villacoublay (FR)

(*) Notice: Subject to any disclaimer, the term of this patent is extended or adjusted under 35 U.S.C. 154(b) by 0 days.

(21) Appl. No.: 10/129,114

(22) PCT Filed: Dec. 28, 2000

(86) PCT No.: PCT/FR00/03718
§ 371 (c)(1),
(2), (4) Date: May 13, 2002

(87) PCT Pub. No.: WO01/49092
PCT Pub. Date: Jul. 5, 2001

(65) Prior Publication Data
US 2002/0172010 A1 Nov. 21, 2002

(30) Foreign Application Priority Data
Dec. 28, 1999 (FR) .............................................. 99 16594

(51) Int. Cl.⁷ ................................................ H05K 7/20
(52) U.S. Cl. ..................... 361/719; 165/80.2; 165/80.3; 165/185; 165/104.33; 454/184; 364/690; 364/704; 364/705; 364/708; 364/715; 364/700
(58) Field of Search ................................ 165/80.3, 185; 361/688, 690, 694–695, 700, 699, 704–710, 715, 719, 720, 724–727; 454/184; 62/259.2, 3.2

(56) References Cited

U.S. PATENT DOCUMENTS

| 4,366,526 A |   | 12/1982 | Lijoi et al. |
|---|---|---|---|
| 5,003,429 A | * | 3/1991 | Baker et al. ................. 361/708 |
| 5,077,637 A |   | 12/1991 | Martorana et al. |
| 5,161,092 A |   | 11/1992 | Smith et al. |
| 5,390,734 A | * | 2/1995 | Voorhes et al. ............. 165/185 |
| 5,991,155 A | * | 11/1999 | Kobayashi et al. ......... 361/705 |
| 6,025,993 A | * | 2/2000 | Wakabaashi et al. ....... 361/705 |
| 6,166,908 A | * | 12/2000 | Samaras et al. ............ 361/700 |
| 6,175,501 B1 | * | 1/2001 | Bortolini et al. ............ 361/720 |
| 6,259,602 B1 | * | 7/2001 | Malhammar ................. 361/704 |
| 6,394,815 B1 |   | 5/2002 | Sarno et al. |

FOREIGN PATENT DOCUMENTS

| GB | 2 145 290 | 3/1985 |
|---|---|---|
| GB | 2 270 207 | 3/1994 |
| JP | 60 007154 | 1/1985 |

* cited by examiner

Primary Examiner—Gregory Thompson
(74) Attorney, Agent, or Firm—Oblon, Spivak, McClelland, Maier & Neustadt, P.C.

(57) ABSTRACT

A structure to improve the cooling of electronic modules of the type including a printed circuit board contained between two covers. The structure extracts, by at least one of the covers, heat produced by at least one component borne by the printed circuit board. According to one feature, the cover responsible for extracting the heat bears at least one device having a high thermal conductivity, making it possible to even out the temperatures of the surface of the cover with which it is in contact. Such a structure may be particularly applied to the electronic modules on board aircraft.

9 Claims, 6 Drawing Sheets

ELECTRONIC MODULE WITH HIGH COOLING POWER

The invention relates to the cooling of modular electronic devices, especially but not exclusively to "on board" devices placed on board aircraft, or tanks, etc.

"On board" devices must operate under harsh environmental conditions (vibrations, shocks, humidity, accelerations, heat dissipation difficulty).

These difficult conditions may cause breakdowns. This means that these electronic units have to be designed for the purpose of making their repair and their maintenance easier.

One of the new aeronautical standards stipulates that they be produced in the form of a modular structure called LRM (Line Replaceable Module), such structures being installed in racks.

A rack may include a large number of electronic modules. This makes rapid maintenance, handling and repair work easy, but tends to make it more difficult to extract the heat produced by the various components contained in the modules. These components, of increasing sophistication, produce increasing amounts of heat. The inventions aims to solve the problem of extracting this heat.

Figure 1:
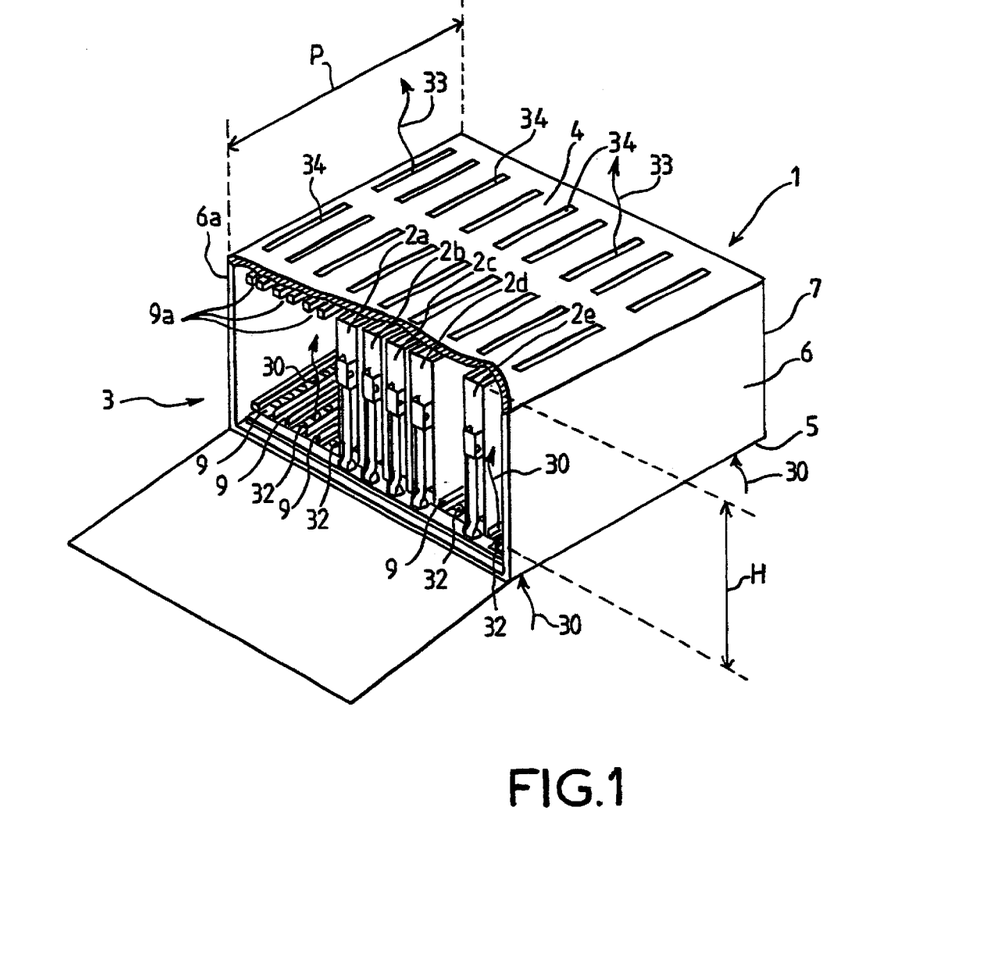
FIG. 1, already described, shows a rack of a known type containing conventional electronic modules.

FIG. 1 shows in perspective a rack 1 containing several electronic modules. The rack 1 is generally parallelepipedal, with a front face 3 for inserting and extracting the electronic modules 2a to 2e and five other faces 4, 5, 6, 6a, 7. The face 7 consists of a back plate which closes off the rack 1 and carries connectors into which the corresponding connectors of the modules 2a to 2e are plugged.

The bottom and top plates 4, 5 have slideways, for example made of metal, respectively 9, 9a, for guiding the electronic modules 2a to 2e in the rack 1 and for keeping them therein.

The rack 1 may include openings for air circulation, for the purpose of cooling the electronic modules 2a to 2e. The cooling air (shown symbolically by arrows labeled 30) is generally injected into the rack via the bottom plate 4, through openings 32 called air inlet openings located between the slideways 9. The cooling air 30 circulates between the modules 2a to 2e (and possibly in these modules). The heat-laden air 33 leaves the rack 1 through outlet openings 34, formed between the slideways 9a and the top plate 5.

Figure 2:
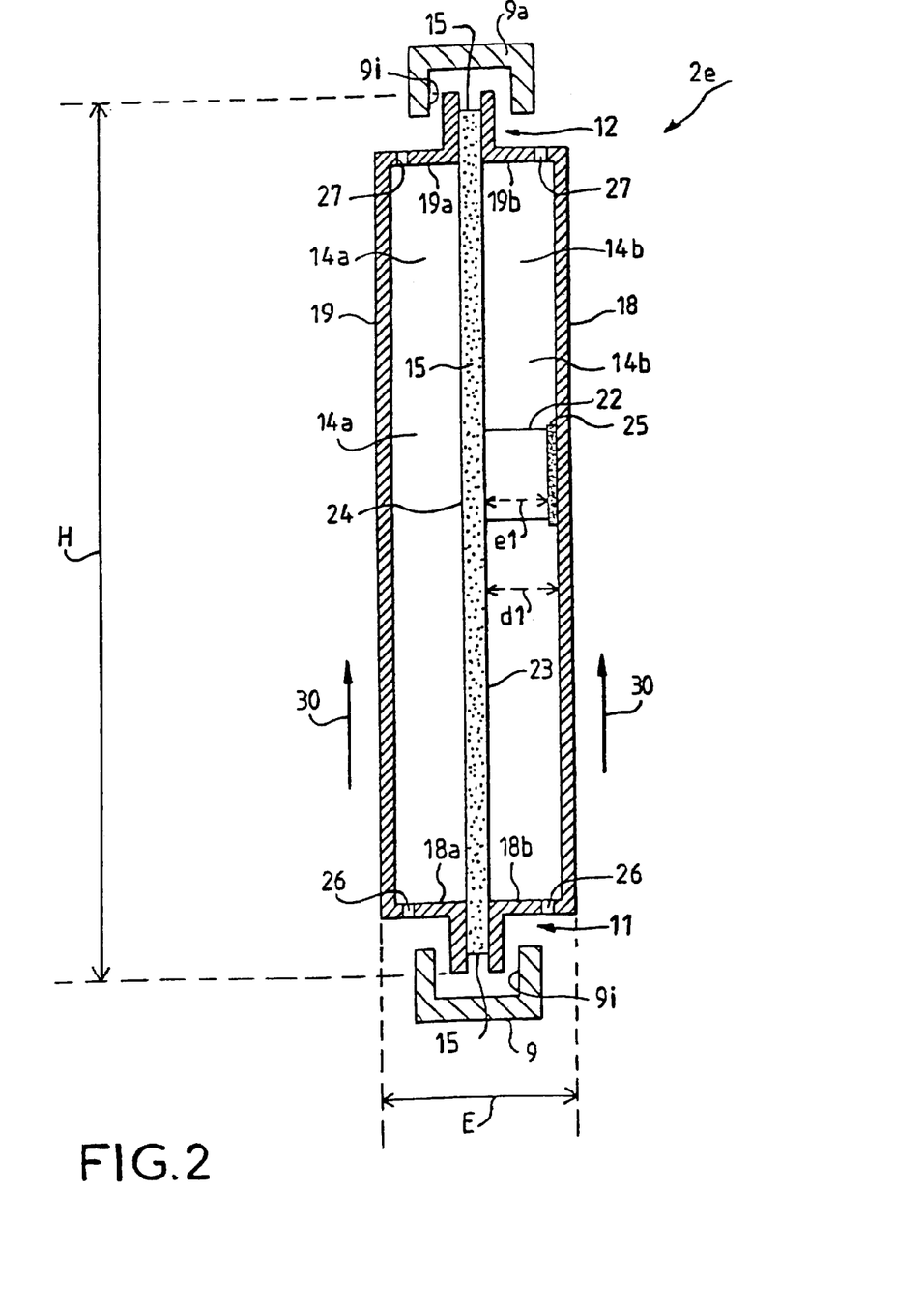
FIG. 2, already described, shows, in a sectional view, the structure of an electronic module illustrated in FIG. 1.

FIG. 2 shows in a simplified manner, in cross section, an example of a conventional electronic module structure, as may be found, for example, in patent GB-A-2 270 207.

The electronic module 2e comprises two covers, 18, 19, for example made of aluminum, having a thickness of the order of 1 millimeter. Aluminum is a particularly advantageous material from the standpoint of on board mass, in that it has both a low density and a very good mechanical rigidity even with a small thickness; it also has a moderate thermal conductivity, although very much less than that of copper.

A printed circuit board 15 is placed in the space bounded by the two covers 18, 19. It is gripped around its periphery by the edges of the covers. The printed circuit board 15 bears the various components of an electronic circuit, among which at least one component 22 is producing a large amount of heat in operation (for example a powerful microprocessor).

In the example in FIG. 2, the component 22 has a thickness e1 which corresponds approximately to a distance d1 between the inside of the first cover 18 and that face (face 23) of the printed circuit which bears the component. The component 22 is thus in practice directly in contact with the first cover 18 via, for example, a thermal interface or matching layer 25 which promotes thermal contact and is electrically insulating (an elastomer or epoxy resin).

Thus, the covers 18, 19, and particularly the first cover 18 in the example shown, provide, in addition to their function of protecting the printed circuit 15 and of electrostatic shielding, a heat sink function.

The heat transmitted to the cover is itself extracted by conduction to the slideways 9, 9a of the rack and then to the walls of the rack; the heat is also extracted by convection, thanks to the cooling air 30 coming from the abovementioned ventilation. Ventilation inside the electronic modules 2a to 2e may be added, by providing bottom and top openings 26, 27 in the bottom and top walls 18a, 18b and 19a, 19b of the covers, respectively.

Even when the three means mentioned above are combined, the extraction of heat may be insufficient with current components. One of the aims of the present invention is to improve this extraction.

For this purpose, the invention provides an electronic module of the type intended to operate in a rack, comprising at least one printed circuit board, at least one protective cover defining a housing for the board, at least one component producing heat in operation and mounted via its bottom face on the board, and a thermal link between a top face of the component and the cover, characterized in that the thermal link comprises, interposed between the top face of the component and the cover, a device having a high thermal conductivity, this device having an area greater than that of the component and having a thermal conductivity greater than that of the cover.

The word "interposed" should be understood to mean that the device is at least partly placed in series between the component and the cover in the thermal circuit of heat flow from the component to the cover. This even applies if the device having a high thermal conductivity also includes a part which extracts the heat directly to the natural air or to the forced circulation air which lies outside the cover. However, in a preferred embodiment, the device having a high thermal conductivity is physically interposed in its entirety between the component and the cover and is applied over its entire area (which is greater than that of the component) against this cover.

The term "device having a high thermal conductivity", or in short "HTC device", should be understood to mean any device or element having a better thermal conductivity than that of the material of which a cover responsible for extracting the heat is made, so as to make it possible to even out or tend to even out the temperature at all points on a surface of the cover with which this HTC device may be brought into contact. They may, for example, when the cover is made of aluminum, be elements based on one or more materials whose thermal conductivity is greater than or equal to that of copper, or else devices which involve changes of phase of a solid, liquid or gaseous element allowing substantial amounts of energy to be transported; some of the latter devices are known especially as "heat pipes" and may consist of a hollow plate containing a liquid, the cooling relying on the energy consumed by the liquid-to-gas phase change in a closed circuit in the hollow plate. In this case, it will be understood that one speaks of an equivalent thermal conductivity, corresponding to the heat extraction capability: the equivalent conductivity is that of an imaginary material which, having the dimensions of the device (for example the heat pipe), would have the same heat extraction capability.

The application of an HTC device to a region of a cover makes this region better able to conduct heat and, as it were, better able to distribute it to the rest of the cover which, although a poorer thermal conductor, then benefits from a larger area conducive to this conduction. This results overall in an increase in the thermal conductivity of the cover, in a ratio very much greater than that of the increase in the mass of the cover resulting from the presence of the HTC device.

Figure 3:
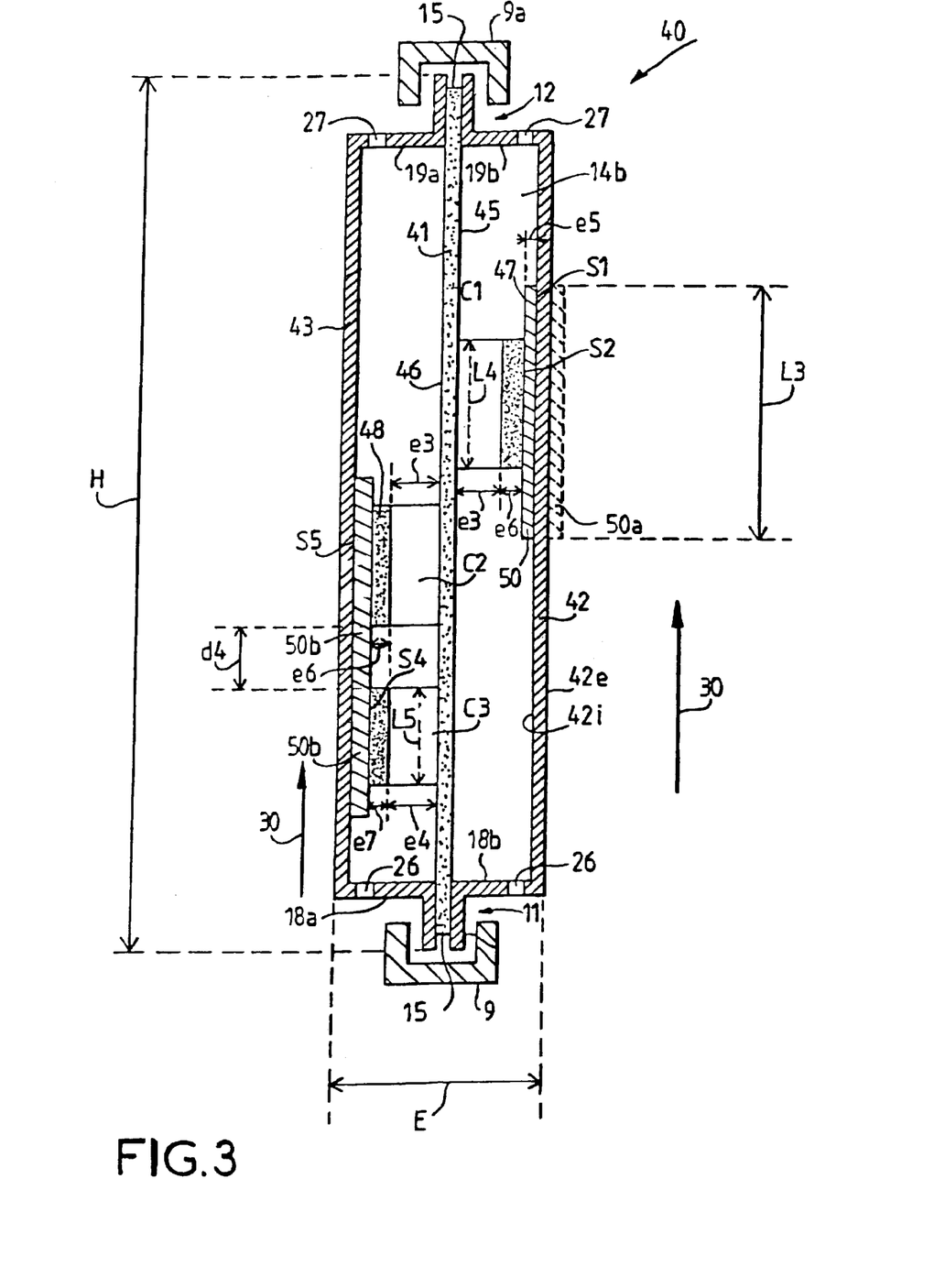
FIG. 3 is a sectional view of an electronic module according to the invention.

A better understanding of the invention, and further features and advantages that it affords, will appear on reading the description which follows, given as nonlimiting example with reference to the appended figures, among which:

FIG. 3 shows an electronic module 40 according to the invention, in a sectional view similar to that of FIG. 2.

The module 40 comprises a printed circuit board 41 between two covers 42, 43, for example made of aluminum, similar to those of FIG. 22.

The board 41 bears components among which are the dissipative components C1, C2, C3 distributed here over both faces 45, 46 of the board.

According to the invention, one (or possibly more) devices having a high thermal conductivity, or HTC devices, 50, 50b are interposed in series (in the direction in which the heat is extracted from the component to the cover) between the top face of certain components (that face opposite the bottom face turned toward the board) and the cover.

A material having a relatively good thermal conductivity (although very much less than that of the HTC device) may fill the gap between the component and the HTC device 50 or 50b when the height of the component and the shape of the casing and of the HTC device allow only the top face of the component to touch the HTC device at the same time as the HTC touches the cover. The materials or products most commonly used to provide this thermal link are, for example, elastomers filled with heat-conducting particles, resins, greases, adhesives, gels and surface treatments. It should be noted that sheets of the phase-change type now exist which consist of a support film bearing a coating which changes state at a given temperature, thereby allowing the microscopic irregularities to be filled and the thermal contact to be improved.

The function of the HTC device 50 is especially to even out or at least greatly reduce the temperature differences presented by a surface with which it is in contact. For this purpose, with the first cover 42 (but also the second cover 43 in the example) being made from aluminum, the HTC device 50 may, for example, be made of copper. However, the HTC device may also be made of any other material having a thermal conductivity greater than that of the material from which the cover bearing it is made; it may be considered that the implementation of the device according to the invention becomes greatly advantageous when its thermal conductivity is greater than or equal to 1.5 times that of the material of which this cover is made (or from which the latter is made).

Among materials possessing a thermal conductivity even greater than that of copper, mention may be made, for example, of materials based on high-conductivity graphite, especially pyrolitic graphite, or composites of the carbon/carbon type, or else materials of the type having a structure formed by a substrate with a coating of diamond. Finally, it should be noted that the HTC device 50 may also be made from a structure employing the phase change of a liquid, solid or gaseous element, as already mentioned above and as will be explained further in the continuation of the description.

The HTC device 50 is in the form of a plate whose thickness e5, for example between 1 and 4 millimeters, is chosen to be greater the higher the thermal power to be extracted.

The HTC device 50, that is to say the HTC plate 50, is preferably designed to have a surface S1 of larger area than that of the surface S2 of the component. Tests have given a very satisfactory result with an area of surface S1 of the HTC plate 50 of about 30 cm$^2$ (for an area of S2 of around 8 cm$^2$) and a thickness e5 of around 1.5 millimeters. These dimensions of the HTC plate are given solely by way of indication and do not constitute a limiting example—they may be tailored to the dissipated power levels; in addition, it should be noted that a reduction in thickness e5 of the HTC plate may be compensated for by an increase in its area and vice versa.

It is possible to further increase the effectiveness of the heat extraction by giving the area of the surface S1 of the HTC plate 50 an elongate shape and by orienting it so that its largest dimension is in the direction most favorable to cooling it. Its largest dimension may, for example, be approximately parallel to the flow of cooling air 30, or parallel to the height H of the electronic module if the slideways 9, 9a constitute a cold source, or else it may be oriented differently, especially according to tests and/or a particular configuration.

The HTC plate 50 may be made and mounted directly (as shown in FIG. 3) on the cover 42, in the factory, that is to say in the same industrial step as that for manufacturing the cover 42. This allows excellent thermal contact to be achieved. If the HTC plate 50 has to be attached to the cover 42 after the latter has been manufactured, it may be advantageous to do this by means of a layer referred to as a thermal interface (not shown) in order to guarantee the quality of the contact.

Of course, it is possible to place, if necessary, several HTC devices 50, 50a, on the same cover 42, 43.

The second and third components C2 and C3 mounted on the second face 46 illustrate another version of the invention, in which a single HTC device or plate, labeled 50b, serves to promote the extraction of the heat produced by several components. The differences in height of the components C2 and C3 are compensated for by the fill material interposed between the top face of the component and the HTC device 50b.

For example, the HTC plate 50b in this configuration has an area of surface S5 of around 42 cm², which allows the heat produced by the two components C2, C3 to be extracted with an efficiency comparable to that described above in regard to component C1.

Figure 4:
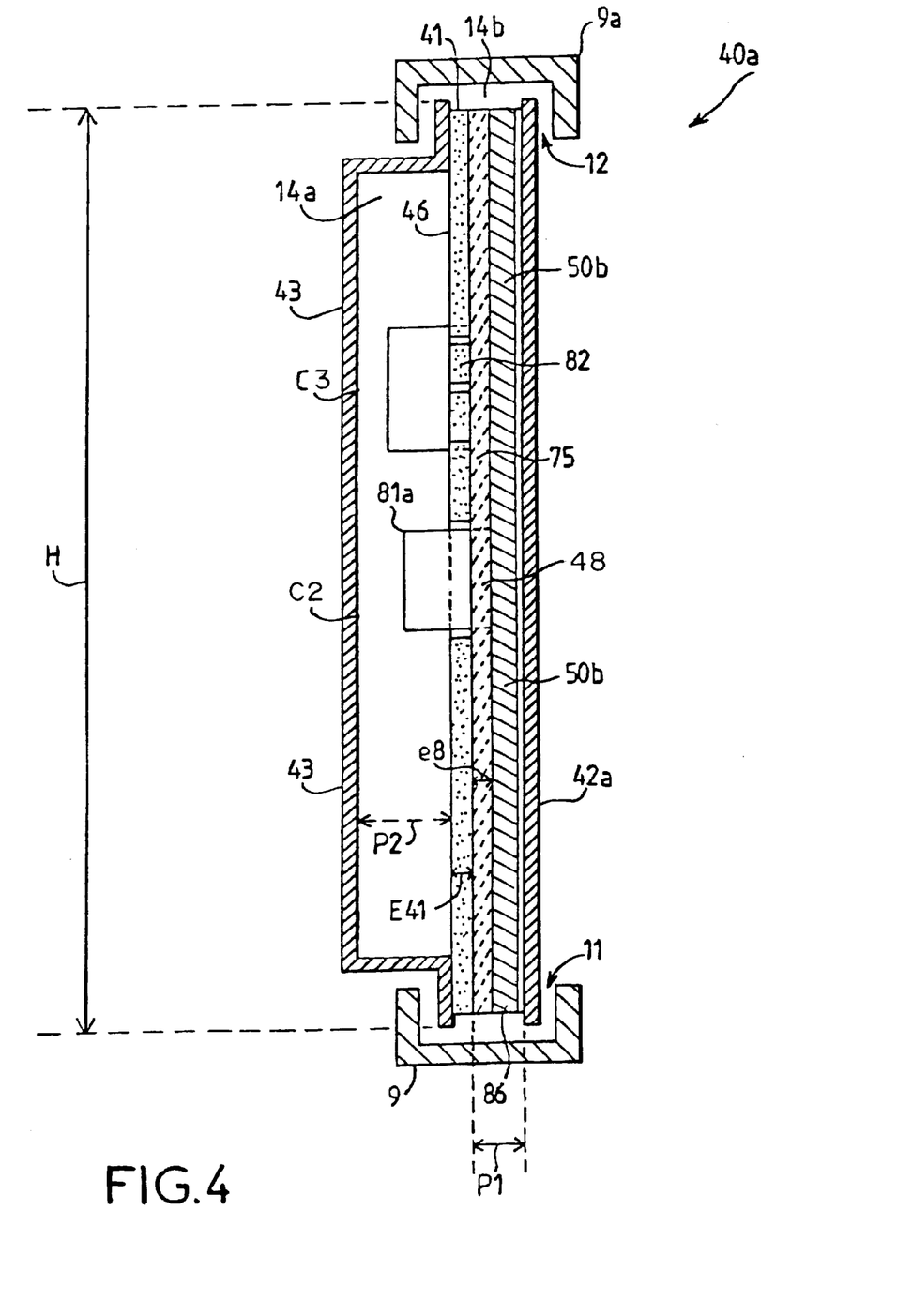
FIG. 4 is a sectional view of an electronic module in another embodiment of the invention.

FIG. 4 shows an electronic module 40a in the configuration that it would have if the heat were to be extracted from the bottom face of the components.

Figure 5:
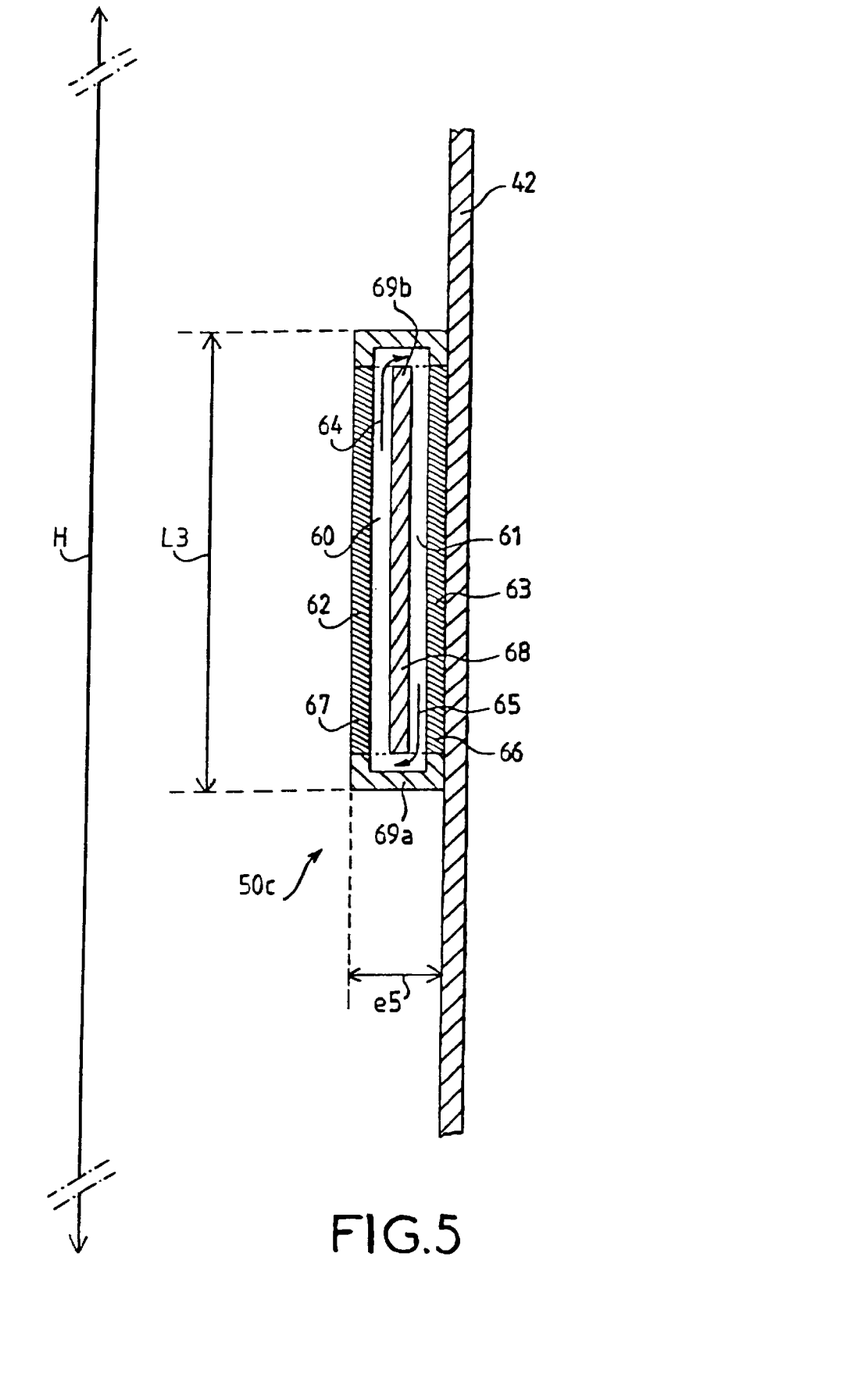
FIG. 5 illustrates, in a sectional view, an embodiment of a device having a high thermal conductivity according to the invention, placed on a cover shown in FIG. 3.

FIG. 5 is a sectional view of an HTC device, labeled 50c, of the type referred to above as a "heat pipe", employing the effect of a phase change in an element, for example a liquid, for example water. The HTC device 50c may be used on either of the covers 42, 42a, 43. In the example, it is shown mounted on the first cover 42 (shown partly in FIG. 5) at the same position, for example, and with the same function as that in the case of the HTC device 50 shown in FIG. 3.

The HTC device 50c is therefore mounted on the inner face 42i of the first cover 42. It is in a form similar to that of the HTC plate 50 with, for example, the same length L3 (parallel to the height H of the cover) but, however, with a thickness e5 may be greater, for example around 3 millimeters, especially depending on the machining means used. In the nonlimiting example of the description, it has two parallel communicating channels 60, 61 which extend parallel to the plane of the cover 42 and which constitute a closed circuit. On these two channels, the first channel 60 is in contact with a hot wall 62 intended to receive heat delivered by the first thermal link 47 illustrated in FIG. 3. The second channel 61 is in itself in contact with a cold second wall 63 which is contact with the cover 42.

Under these conditions, a certain quantity of water contained in the first channel 60 passes into the vapor phase when it is heated by the first wall 62 and it passes in vapor form (shown symbolically by an arrow 64) into the cooler second channel 61, where the vapor condenses and then returns in water form 65 to the first channel 60.

The closed circuit consisting of the two channels or microchannels 60, 61 may be easily produced on an industrial scale in copper or any other material having a good thermal conductivity. These two channels may be formed by narrow grooves machined, for example, in copper plates 66, 67 separated by an intermediate plate 68 and closed by end pieces 69a, 69b. Narrow grooves, for example 1 or 2 millimeters, for closing the channels, allows several such closed circuits to be reproduced, in parallel, in the dimensions allocated to the HTC device 50c.

The very high heat transfer capacity that phase-change systems such as the HTC device 50c possess allows them to create a homogeneous and substantially uniform temperature distribution over the entire surface of the cover 42 to which they are applied.

Figure 6A:
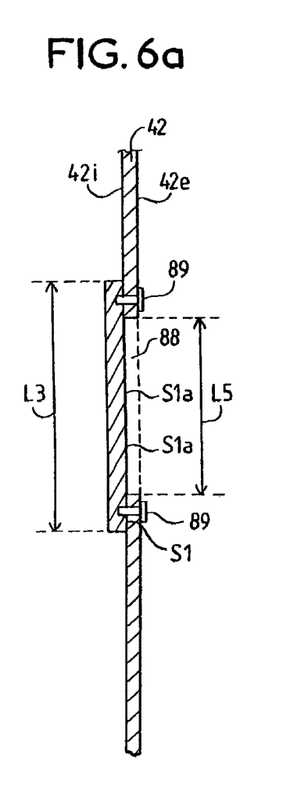
FIG. 6a is a sectional view showing a cover illustrated in FIG. 5, in which an opening facing a device having a high thermal conductivity is made.

The increase in the mass of a cover 42, 42a, 43 by the presence of an HTC device may be compensated for by making, in this cover, an opening facing at least one HTC device, as shown in FIG. 6a.

FIG. 6a shows schematically, and partly, a cover such as, for example, the first cover 42, in a sectional view similar to that of FIG. 5. The cover 42 bears any one of the HTC devices described above, for example the first HTC device 50 illustrated in FIG. 3. In the example shown, the HTC device 50 is mounted on the inner face 42i of the cover 42. According to one feature of the invention, the cover 42 has one (or more) openings 88 formed opposite the HTC device 50. The opening 88 may have dimensions (of which only the length L5 is shown) slightly smaller than those of the HTC device (of which only the length L3 is shown) so that the HTC device closes the opening 88. Part of the HTC device is in direct contact, outside the cover, with the external air. However, the HTC device is thermally linked to the cover 42 at least around the periphery of the opening 88, so that the cover for its part contributes to extraction of the heat from the component. Here again, the surface area of the HTC device is greater than that of the component with which it is in contact (preferably direct contact).

The nonlimiting example in FIG. 6a shows a case in which the HTC device 50 is attached to the cover 42, after the latter has been manufactured, and in the example it is fixed by screws 89 to the inner face 42i of this cover.

Figure 6B:
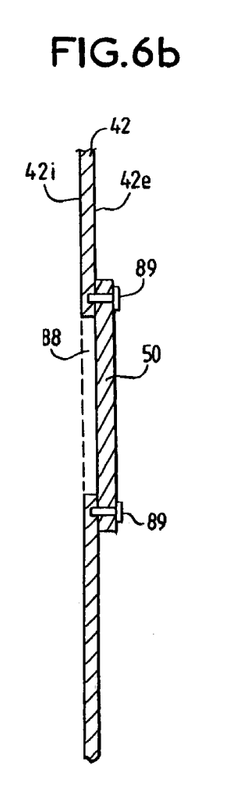
FIG. 6b is a sectional view showing the cover and the device having a high thermal conductivity illustrated in FIG. 6, but with the latter being positioned differently.

FIG. 6b is a view of the cover 42 similar to that of FIG. 6a, also showing an opening 88. But in the case of FIG. 6b, the HTC device 50 is attached to the cover 42 from the outside, that is to say it is fixed to the outer face 42e of this cover. The HTC device 50 may thus be attached to the cover 42 from the outside or else from the inside (FIG. 6a), especially for reasons of ease of removing the cover.

Figures 6C, 7:
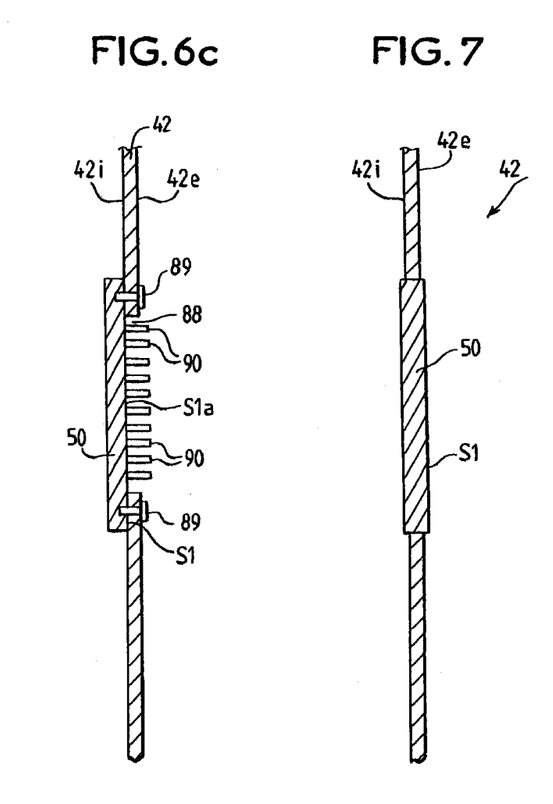
FIG. 6c is a sectional view similar to FIG. 6a and furthermore illustrating that the device having a high thermal conductivity is provided with cooling fins.
FIG. 7 is a sectional view of the cover illustrated in FIG. 5, showing an embodiment of the invention in which a device having a high thermal conductivity forms an integral part of the cover.

FIG. 6c is a view of the cover 42 which differs from that of FIG. 6a solely by the fact that the HTC device 50 includes cooling fins 90. The HTC device 50 is fixed to the inner face 42i of the cover 42 and that part S1a of its surface S1 which opens to the outside, by virtue of the opening 88, is provided with fins 90 which tend to promote its cooling.

FIG. 7 is a sectional view of a cover, for example the cover 42, and it shows another way of placing an HTC device 50. In this version, the HTC device 50 is placed in the extension of the plate which forms the cover and it forms an integral part of the cover; the HTC device may either be obtained directly by machining or, for example, be produced separately and fastened to the cover by welding, for example after it has been fitted into an opening (not shown) made in this cover. It will be understood that, in this case, the device is considered to be inserted at least partly in series between the component and the cover, via its periphery welded to the cover.

Of course, in this latter version of the invention, the HTC device 50 may optionally be provided with fins 90 (not shown in FIG. 7), optionally over its entire surface S1.

What is claimed is:

1. An electronic module configured to operate in a rack, comprising:
    at least one printed circuit board;
    at least one protective cover defining a part of a housing for the a least one printed circuit board;
    at least one component producing heat in operation and mounted by its bottom face on the at least one printed circuit board; and
    a thermal link interposed between a top face of the at least one component and the at least one protective cover, and comprising a device having a high thermal conductivity, having a first contact surface area greater than a second contact surface area of the at least one component by a factor of at least two, and having a thermal conductivity greater than that of a material of the at least one protective cover.

2. The electronic module as claimed in claim 1, wherein the device having a high thermal conductivity comprises a plate.

3. The electronic module as claimed in claim 2, wherein the device having a high thermal conductivity includes a hollow heat-pipe plate, operating on a principle of a change of phase, in a closed circuit, of a liquid contained in the hollow heat-pipe plate.

4. The electronic module as claim in claim 1, wherein the device having a high thermal conductivity has a thermal conductivity equal to or greater than 1.5 times that of said material of the at least one protective cover.

5. The electronic module as claimed in claim 1, wherein the device having a high thermal conductivity has an elongated shape to have a larger dimension, to allow said larger dimension to be oriented favorably for cooling the at least one component.

6. The electronic module as claimed in claim 1, wherein the at least one protective cover has an opening formed substantially opposite the device having a high thermal conductivity.

7. The electronic module as claimed in claim 1, wherein the device having a high thermal conductivity forms an integral part of the at least one protective cover.

8. The electronic module as claimed in claim 1, wherein said factor is about 2.62.

9. The electronic module as claimed in claim 1, wherein said factor is about 3.75.

* * * * *